(12) United States Patent
Sasaki et al.

(10) Patent No.: US 11,375,643 B2
(45) Date of Patent: Jun. 28, 2022

(54) INVERTER DEVICE AND ELECTRIC COMPRESSOR

(71) Applicant: IHI Corporation, Koto-ku (JP)

(72) Inventors: Yuji Sasaki, Koto-ku (JP); Hirofumi Horiuchi, Nagano (JP); Jun Takizawa, Nagano (JP); Eiji Takamura, Nagano (JP); Teruyuki Wada, Nagano (JP)

(73) Assignee: IHI Corporation, Koto-ku (JP)

( * ) Notice: Subject to any disclaimer, the term of this patent is extended or adjusted under 35 U.S.C. 154(b) by 236 days.

(21) Appl. No.: 16/763,008

(22) PCT Filed: Nov. 6, 2018

(86) PCT No.: PCT/JP2018/041141
§ 371 (c)(1),
(2) Date: May 11, 2020

(87) PCT Pub. No.: WO2019/098088
PCT Pub. Date: May 23, 2019

(65) Prior Publication Data
US 2020/0390000 A1    Dec. 10, 2020

(30) Foreign Application Priority Data
Nov. 14, 2017   (JP) .............................. JP2017-219307

(51) Int. Cl.
*H05K 7/20*   (2006.01)
(52) U.S. Cl.
CPC ......... *H05K 7/209* (2013.01); *H05K 7/20927* (2013.01)

(58) Field of Classification Search
CPC .. H05K 7/2089; H05K 7/209; H05K 7/20909; H05K 7/20918
See application file for complete search history.

(56) References Cited

U.S. PATENT DOCUMENTS

| 10,385,837 B2* | 8/2019 | Jung ..................... F04B 35/04 |
| 2009/0087322 A1 | 4/2009 | Toyama et al. |

(Continued)

FOREIGN PATENT DOCUMENTS

| JP | 2004-303932 A | 10/2004 |
| JP | 2009-89525 A | 4/2009 |

(Continued)

OTHER PUBLICATIONS

International Search Report dated Jan. 29, 2019 in PCT/JP2018/041141, 1 page.

*Primary Examiner* — Matthew V Nguyen
(74) *Attorney, Agent, or Firm* — Oblon, McClelland, Maier & Neustadt, L.L.P.

(57) ABSTRACT

An inverter unit includes a circuit board that has a power device and a capacitor configuring an inverter circuit and provided on a front surface and an exposure region provided on a rear surface, a lower case that is provided with an exposure opening for exposing the exposure region and supports a surrounding area of the exposure region, and an upper case that is provided with a rib structure pressed against the front surface of the circuit board and pressurizing the circuit board toward the lower case and has the lower case attached thereto. The circuit board is sandwiched between the lower case and the upper case.

4 Claims, 10 Drawing Sheets

(56) References Cited

U.S. PATENT DOCUMENTS

| | | | |
|---|---|---|---|
| 2009/0244854 A1 | 10/2009 | Hattori et al. | |
| 2010/0172770 A1 | 7/2010 | Ichise et al. | |
| 2013/0119834 A1 | 5/2013 | Nakagami et al. | |
| 2015/0288258 A1 | 10/2015 | Hattori et al. | |
| 2018/0279504 A1* | 9/2018 | Yoshikawa | H02K 5/18 |
| 2020/0166034 A1* | 5/2020 | Song | F04B 39/121 |
| 2020/0196491 A1* | 6/2020 | Lee | H05K 7/202 |

FOREIGN PATENT DOCUMENTS

| | | | | |
|---|---|---|---|---|
| JP | 2009-106075 A | 5/2009 | | |
| JP | 2009-235965 A | 10/2009 | | |
| JP | 2010-110066 A | 5/2010 | | |
| JP | 2012-092747 A | 5/2012 | | |
| JP | 5010516 B2 | 8/2012 | | |
| JP | 5285258 B2 | 9/2013 | | |
| JP | 5308008 B2 | 10/2013 | | |
| JP | 2014-114725 A | 6/2014 | | |
| JP | 2015-186344 A | 10/2015 | | |
| JP | 2016-123164 A | 7/2016 | | |
| JP | 6037809 B2 | 12/2016 | | |
| JP | 2019033197 | * | 2/2019 | H01L 23/40 |
| WO | WO-2014103482 A1 | * | 7/2014 | F04B 39/121 |

* cited by examiner

Fig.4
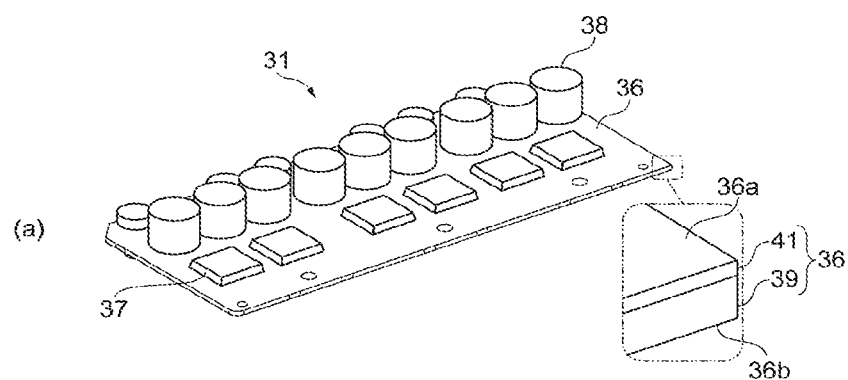
(a)
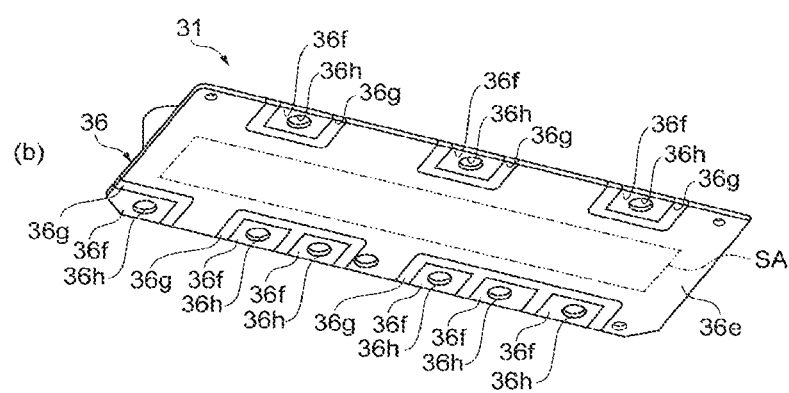
(b)

Fig.9
(a)
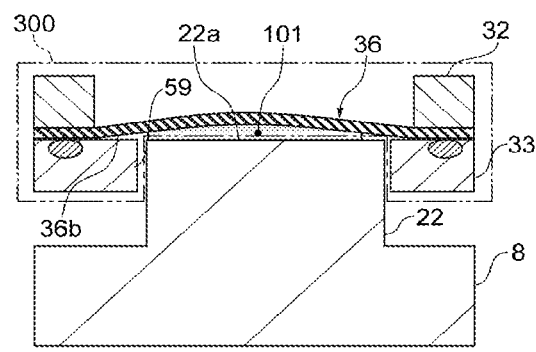
(b)
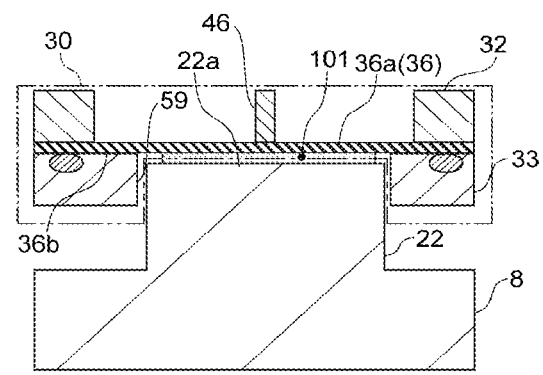

INVERTER DEVICE AND ELECTRIC COMPRESSOR

TECHNICAL FIELD

The present disclosure relates to an inverter device and an electric compressor.

BACKGROUND ART

Patent Literature 1 and Patent Literature 2 disclose inverter-type electric compressors. The electric compressor of Patent Literature 1 includes a housing into which an electric motor and a compression mechanism are built. An inverter accommodation portion is provided in an outer circumference of the housing. An inverter device is disposed in the inverter accommodation portion. The inverter device converts a direct current provided from a high-voltage power source into a three-phase alternating current. Further, the inverter device supplies a three-phase alternating current to the electric motor. The electric compressor of Patent Literature 2 has a compression mechanism, an electric motor which drives the compression mechanism, and an inverter control device which controls the electric motor. These devices are integrated. The inverter control device includes a control board and a power board.

CITATION LIST

Patent Literature

[Patent Literature 1] Japanese Unexamined Patent Publication No. 2009-235965
[Patent Literature 2] Japanese Unexamined Patent Publication No. 2009-89525

SUMMARY OF INVENTION

Technical Problem

Electrical components constituting an inverter device generate heat. There are cases in which performances of the electrical components are affected when the temperatures of the electrical components rise. Accordingly, ability for discharging heat generated by an inverter device, that is, heat dissipation of an inverter device is regarded as important in design of an inverter device.

Here, the present disclosure will describe an inverter device and an electric compressor, in which heat dissipation can be improved.

Solution to Problem

According to an embodiment of the present disclosure, there is provided an inverter device including a circuit board configured to have an inverter circuit provided on a front surface and a heat dissipation portion provided on a rear surface, a first case portion configured to be provided with an opening portion for exposing the heat dissipation portion and to support a surrounding area of the heat dissipation portion, and a second case portion configured to be provided with a rib structure pressed against the front surface of the circuit board and pressurizing the circuit board toward the first case portion side and to have the first case portion attached thereto. The circuit board is sandwiched between the first case portion and the second case portion.

Effects of Invention

According to the present disclosure, an inverter device and an electric compressor, in which heat dissipation can be improved will be described.

The part (a) of FIG. 4 is a perspective view of a circuit board viewed from a side in front. The part (b) of FIG. 4 is a perspective view of the circuit board viewed from a side to the rear.

Figure 5:
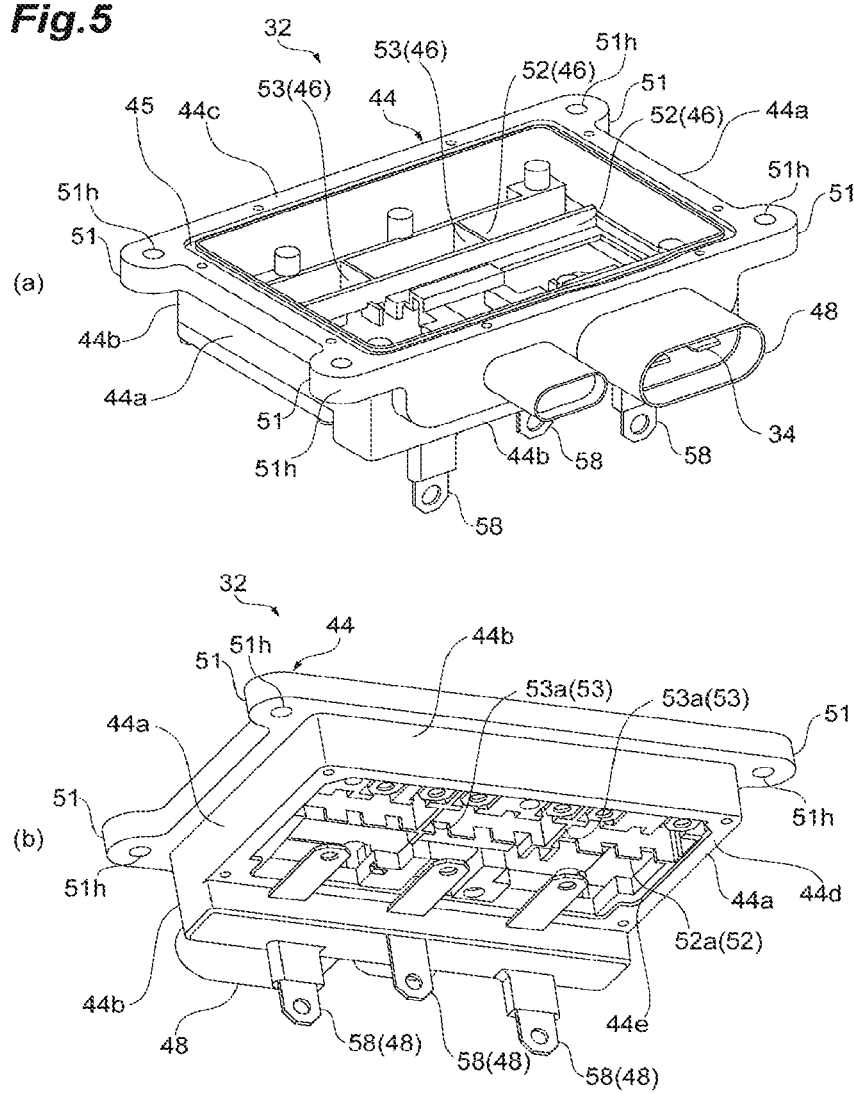

The part (a) of FIG. 5 is a perspective view of an upper case viewed from the side in front. The part (b) of FIG. 5 is a perspective view of the upper case viewed from the side to the rear.

Figure 6:
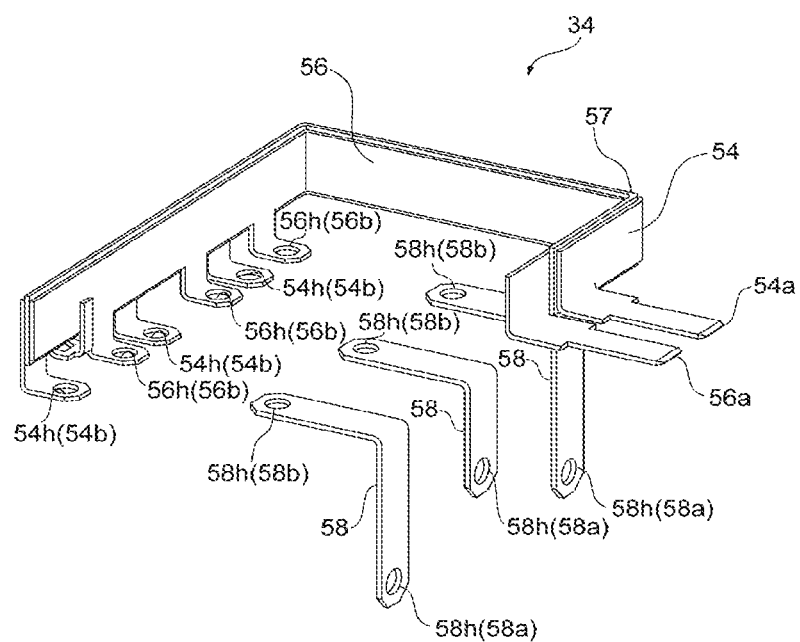

FIG. 6 is a perspective view illustrating a structure of an input/output circuit.

Figure 7:
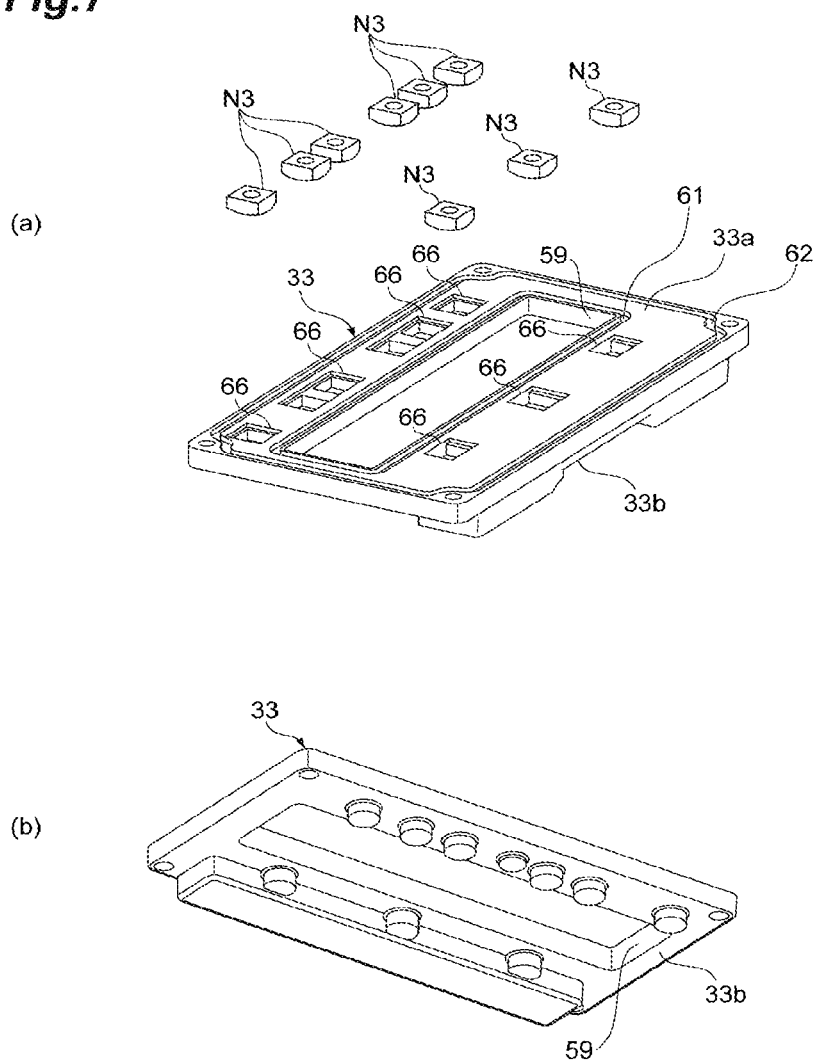

The part (a) of FIG. 7 is a perspective view of a lower case viewed from the side in front. The part (b) of FIG. 7 is a perspective view of the lower case viewed from the side to the rear.

Figure 8:
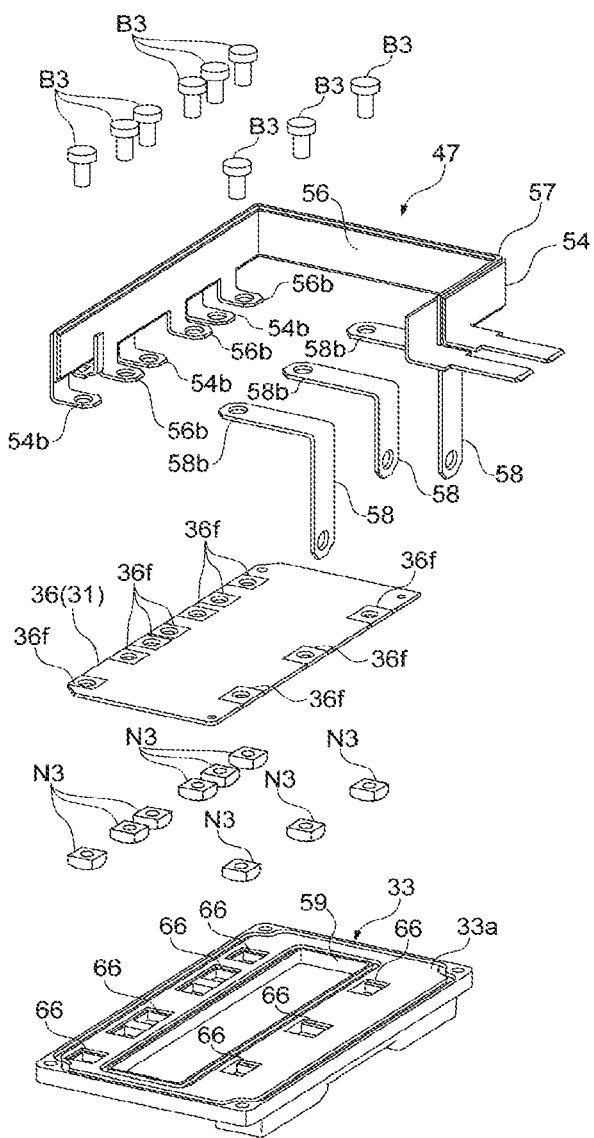

FIG. 8 is an exploded perspective view illustrating a relationship between the lower case, the circuit board, and the input/output circuit.

The part (a) of FIG. 9 is a cross-sectional view illustrating operational effects of the inverter unit according to a comparative example. The part (b) of FIG. 9 is a cross-sectional view illustrating operational effects of the inverter unit according to an embodiment.

Figure 10:
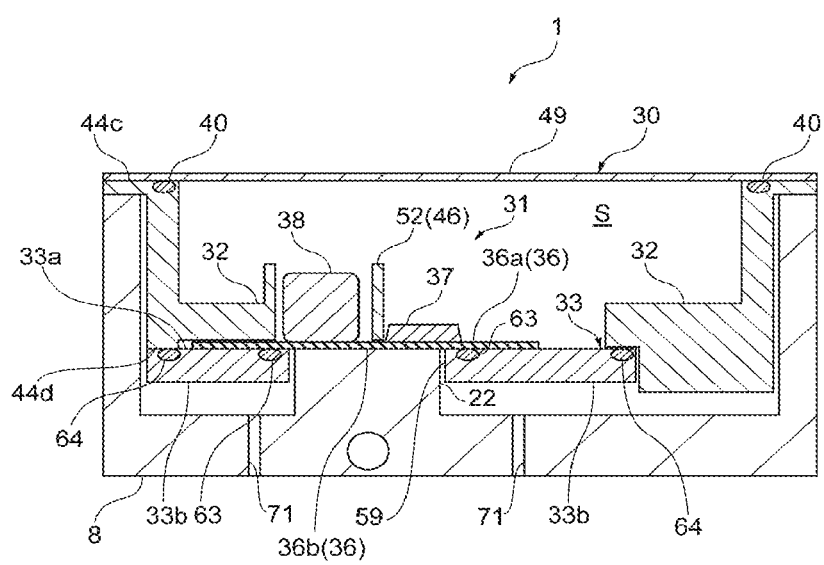

FIG. 10 is a cross-sectional view illustrating water stopping characteristics of the inverter unit.

DESCRIPTION OF EMBODIMENT

An inverter device according to an embodiment of the present disclosure includes a circuit board configured to have an inverter circuit provided on a front surface and a heat dissipation portion provided on a rear surface, a first case portion configured to be provided with an opening portion for exposing the heat dissipation portion and to support a surrounding area of the heat dissipation portion, and a second case portion configured to be provided with a rib structure pressed against the front surface of the circuit board and pressurizing the circuit board toward the first case portion side and to have the first case portion attached thereto. The circuit board is sandwiched between the first case portion and the second case portion.

In this inverter device, the heat dissipation portion included on the rear surface of the circuit board provided with the inverter circuit is exposed through the opening portion of the first case portion. Accordingly, heat generated in the circuit board can be efficiently guided to the outside of the inverter device from the heat dissipation portion. Moreover, the second case portion has the rib structure. The rib structure pressurizes the circuit board toward the first case portion. As a result, bending of the circuit board is curbed when a force acts on the circuit board via the opening portion. Accordingly, enlargement of a gap between the rear surface of the circuit board and a component facing the rear surface of the circuit board is curbed. Increase in gap leads to increase in heat resistance. Increase in heat resistance between the circuit board and a component facing the circuit board is curbed by curbing enlargement of a gap with the rib structure. As a result, heat dissipation in the inverter device can be improved.

The inverter device may further include a first seal member which is interposed between the rear surface of the circuit board and a front surface of the first case portion, and a second seal member which is interposed between the front surface of the first case portion and a rear surface of the second case portion. According to the first seal member, infiltration of liquid or gas from between the circuit board and the first case portion can be curbed. Moreover, according to the second seal member, infiltration of liquid or gas from between the first case portion and the second case portion can be curbed.

The first case portion may be attached to the rear surface of the second case portion, and an opening portion may be provided thereon. The second case portion may have a bus bar electrically connected to the circuit board. The bus bar may be pressed against the front surface of the circuit board. According to these configurations, the bus bar can be reliably connected to the circuit board.

An electric compressor according to another aspect of the present disclosure includes the inverter device described above and a casing which has an inverter accommodation portion accommodating the inverter device. The inverter accommodation portion includes a heat sink to which the heat dissipation portion of the circuit board included in the inverter device is thermally connected. The electric compressor includes the inverter device described above. Accordingly, heat dissipation of the inverter device is improved, and thus the electric compressor can be reliably operated.

Hereinafter, the inverter device and the electric compressor of the present disclosure will be described in detail with reference to the accompanying drawings. In description of the drawings, the same reference signs are applied to the same elements, and duplicate description will be omitted.

<Electric Compressor>

Figure 1:
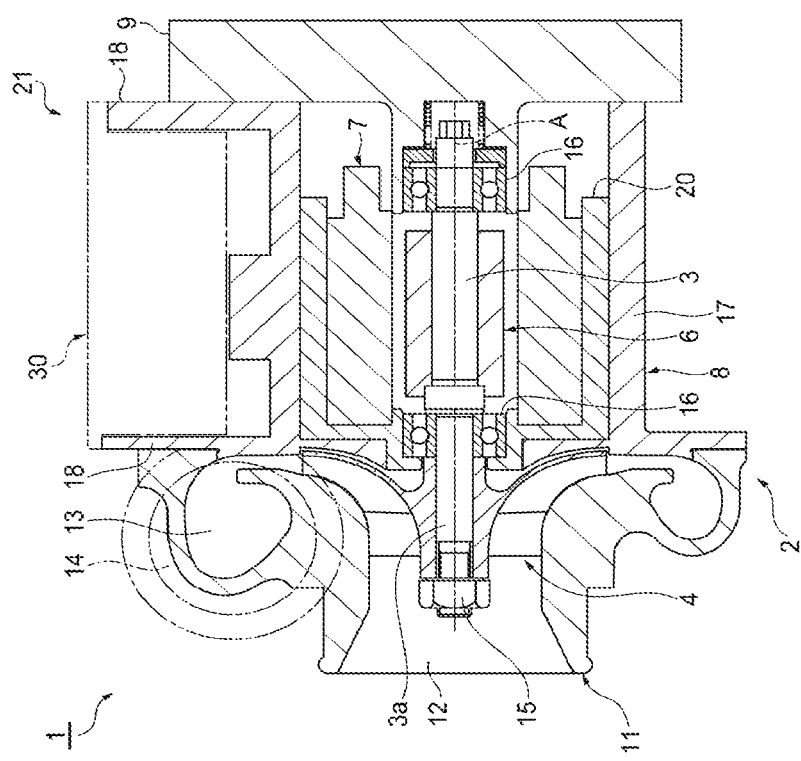
FIG. 1 is a cross-sectional view illustrating a structure of an electric compressor.

For example, an electric compressor 1 illustrated in FIG. 1 is applied to internal combustion engines of vehicles and ships. The electric compressor 1 generates compressed air to be provided to an internal combustion engine.

The electric compressor 1 has a rotation shaft 3 and a compressor impeller 4. The rotation shaft 3 is rotatably supported inside a housing 2. The compressor impeller 4 is fastened to a tip portion 3a of the rotation shaft 3. The housing 2 has a motor housing 8 (casing) and a base housing 9. The motor housing 8 stores a rotor portion 6 and a stator portion 7. The base housing 9 closes an opening of the motor housing 8 on a second end side. The second end side indicates the right side in FIG. 1 and a side opposite to the compressor impeller 4. The rotor portion 6 and the stator portion 7 are accommodated in a stator case 20. The stator case 20 is accommodated in the motor housing 8. A compressor housing 11 is provided on a first end side of the motor housing 8. The first end side indicates the left side in FIG. 1, that is, the compressor impeller 4 side. The compressor housing 11 stores the compressor impeller 4. The compressor housing 11 includes an intake port 12, a scroll portion 13, and a discharge port 14.

The rotor portion 6 is attached to a central portion of the rotation shaft 3 in a direction along a rotation axis A. The rotor portion 6 includes one or a plurality of permanent magnets (not illustrated) attached to the rotation shaft 3. The stator portion 7 surrounds the rotor portion 6. In addition, the stator portion 7 is attached to an inner surface of the motor housing 8. The stator portion 7 includes a coil portion (not illustrated). When an alternating current is supplied to the coil portion of the stator portion 7, interaction occurs between the rotor portion 6 and the stator portion 7. Due to the interaction, the rotation shaft 3 and the compressor impeller 4 integrally rotate centering on the rotation axis A. When the compressor impeller 4 rotates, the electric compressor 1 suctions outside air through the intake port 12. Suctioned air is compressed through the scroll portion 13. Further, the electric compressor 1 discharges compressed air through the discharge port 14. Compressed air discharged through the discharge port 14 is supplied to the internal combustion engine described above.

The electric compressor 1 has bearings 16. The bearings 16 rotatably support the rotation shaft 3 with respect to the housing 2. In addition, the rotation shaft 3 is supported by a pair of bearings 16. One bearing 16 is provided in an end portion of the motor housing 8 on the compressor impeller 4 side. The other bearing 16 is provided in a part protruding from the base housing 9 to the compressor impeller 4 side in a direction along the rotation axis A. For example, the compressor impeller 4 is attached to the rotation shaft 3 by a shaft end nut 15 provided at the tip portion 3a of the rotation shaft 3.

<Motor Housing>

Figure 2:
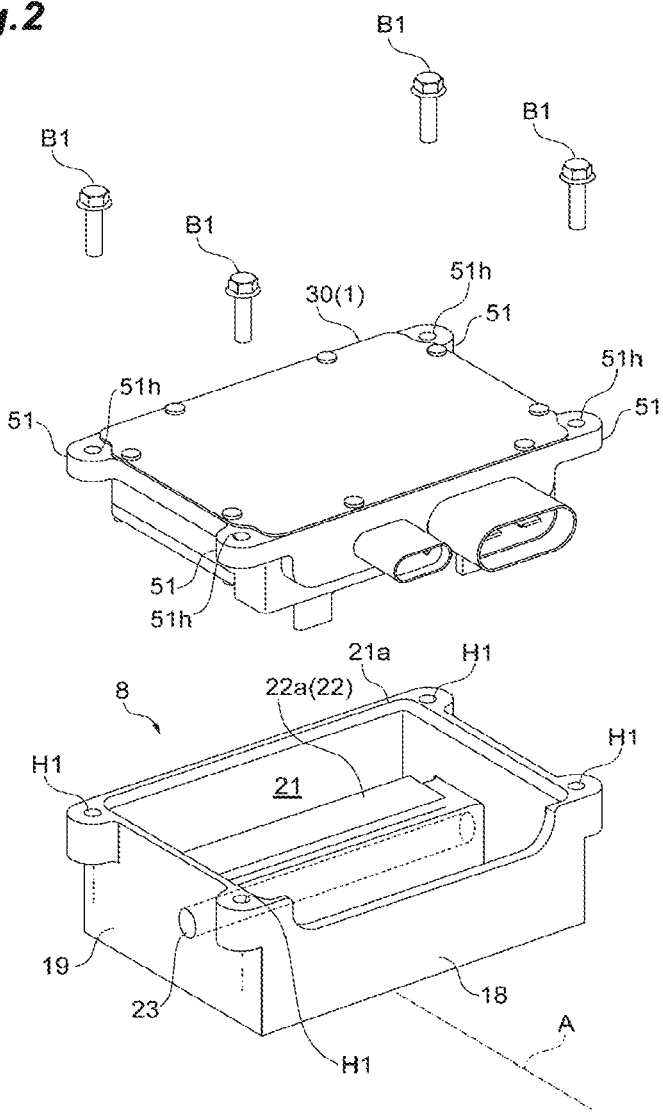
FIG. 2 is an exploded perspective view illustrating an attachment structure of an inverter unit.

An attachment structure of an inverter unit 30 (inverter device) included in the electric compressor 1 will be described. As illustrated in FIG. 2, the inverter unit 30 is unitized. The inverter unit 30 is accommodated in the motor housing 8. In other words, the electric compressor 1 has the inverter unit 30.

The inverter unit 30 is disposed in an outer circumferential portion of the motor housing 8. The motor housing 8 is made of metal. As an example, the motor housing 8 is formed of an aluminum alloy. For example, the motor housing 8 has a circumferential wall 17 (refer to FIG. 1), a first outer wall 18, and a second outer wall 19. The shape of the circumferential wall 17 is a cylindrical shape centering on the rotation axis A. The first outer wall 18 is integrally formed in the outer side of the circumferential wall 17. A pair of first outer walls 18 extend in a manner of being orthogonal to a direction of the rotation axis A. A pair of second outer walls 19 extend in a manner of being parallel to a direction of the rotation axis A. The first outer walls 18 and the second outer walls 19 form an inverter accommodation portion 21. The inverter accommodation portion 21 is surrounded by the first outer walls 18, the second outer walls 19, and a bottom surface. Moreover, in the inverter accommodation portion 21, an upper surface side is open. The inverter accommodation portion 21 has an opening 21a. The inverter unit 30 is disposed inside the inverter accommodation portion 21 through the opening 21a. The opening 21a is integrally formed with the outer circumferential portion of the motor housing 8.

The inverter unit 30 is fixed to the motor housing 8 using four bolts B1 (fastening members). Accordingly, the motor housing 8 has four screw holes H1 into which the bolts B1 are screwed. The screw holes H1 are provided respectively at four corners where the first outer walls 18 and the second outer walls 19 are coupled to each other.

The motor housing 8 has a cooling structure for cooling the inverter unit 30. Specifically, as a cooling structure, the motor housing 8 has a heat sink 22 and a cooling water channel 23. The heat sink 22 is provided on the bottom surface of the inverter accommodation portion 21. In addition, the heat sink 22 protrudes from the bottom surface toward the opening 21a. The shape of the heat sink 22 is a rectangular parallelepiped shape. The heat sink 22 has a thermal connection surface 22a. The thermal connection surface 22a having a flat rectangular surface shape faces the inverter unit 30. The cooling water channel 23 is a penetration hole and is provided inside the casing of the motor housing 8. For example, the cooling water channel 23 is provided in the vicinity of the heat sink 22. For example, predetermined cooling water is supplied to the cooling water channel 23 from the outside of the motor housing 8. The cooling water circulates in the cooling water channel 23 and is then discharged to the outside of the motor housing 8. The cooling water passes through the inside of the motor housing 8. Accordingly, the cooling water has no relationship with water stopping characteristics of the inverter unit 30.

According to such a cooling structure, heat generated by the inverter unit 30 moves from the inverter unit 30 to the heat sink 22 of the motor housing 8 via the thermal connection surface 22a of the heat sink 22. Heat which has moved to the heat sink 22 moves to the cooling water flowing in the cooling water channel 23. Further, heat is discharged to the outside of the motor housing 8 together with the cooling water.

<Inverter Unit>

The inverter unit 30 will be described in detail. The inverter unit 30 converts a direct current provided from a power source (not illustrated) into a three-phase alternating current. The inverter unit 30 provides a three-phase alternating current to the stator portion 7.

Figure 3:
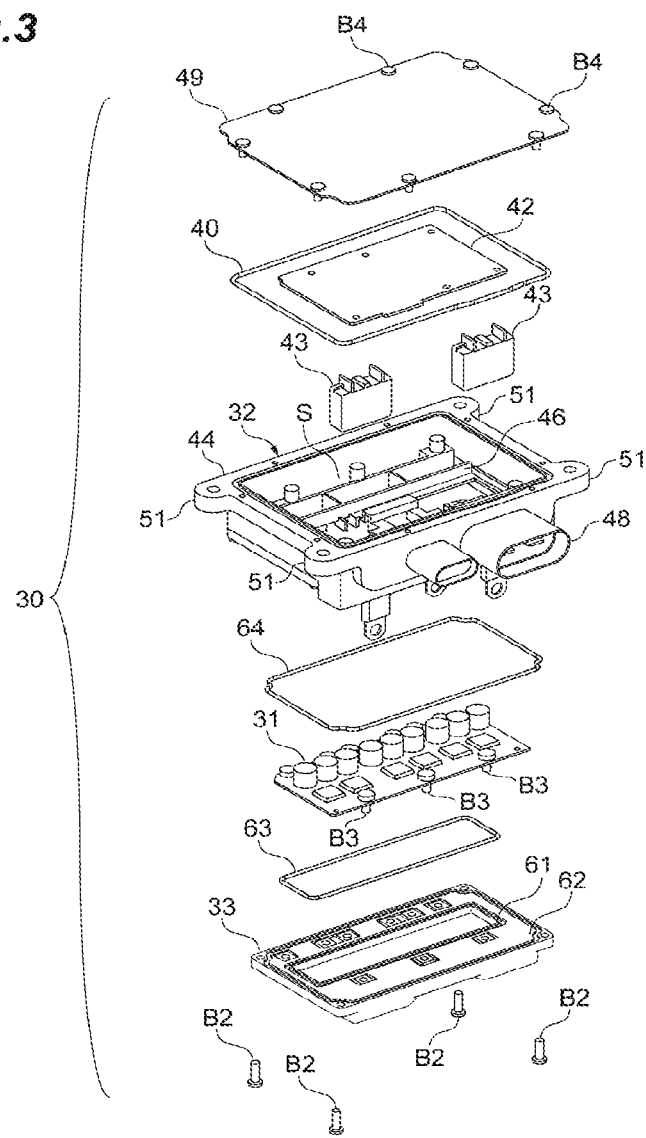
FIG. 3 is an exploded perspective view illustrating an internal structure of the inverter unit.

As illustrated in FIG. 3, the inverter unit 30 has a circuit board 31, an upper case 32 (second case portion), and a lower case 33 (first case portion). The circuit board 31 is an inverter. The circuit board 31 converts a direct current into a three-phase alternating current. The upper case 32 and the lower case 33 are resin cases. The upper case 32 and the lower case 33 form an accommodation space S for the circuit board 31 and other components (a control board 42, a current sensor 43, and the like). In the accommodation space S, infiltration of water from the outside is curbed. The resin cases have a structure hindering movement of liquid to the accommodation space S from the outside.

<Circuit Board>

The circuit board 31 is electrically connected to an input/output circuit 34 (refer to FIG. 6), which will be described below. The circuit board 31 is sandwiched between the resin upper case 32 and the resin lower case 33. As a result, the position of the circuit board 31 is held. As illustrated in the part (a) of FIG. 4, the circuit board 31 has an aluminum substrate 36, a power device 37, and a capacitor 38.

The shape of the aluminum substrate 36 is a rectangular plate shape. The aluminum substrate 36 has a metal plate 39 and an insulation film 41. As an example, the metal plate 39 is made of aluminum. The insulation film 41 is provided on the front surface of the metal plate 39. The power device 37 and the capacitor 38 (electrical components) are disposed in the insulation film 41. The insulation film 41 forms a front surface 36a of the aluminum substrate 36. A wiring pattern (not illustrated) provided such that it performs a predetermined function is provided in the insulation film 41. The power device 37, the capacitor 38, and the wiring pattern constitute an inverter circuit.

The rear surface of the metal plate 39 becomes a rear surface 36b of the aluminum substrate 36. The insulation film 41 is not provided on the rear surface 36b. The rear surface 36b of the aluminum substrate 36 exposes an aluminum surface. Accordingly, heat moves more easily on the rear surface 36b than on the front surface 36a on which the insulation film 41 is provided. The rear surface 36b includes an exposure region SA (heat dissipation portion, refer to the part (b) of FIG. 4) which is exposed from the lower case 33.

As illustrated in the part (b) of FIG. 4, the aluminum substrate 36 has a plurality of holes 36h. The holes 36h are used for ensuring electrical connection. The holes 36h are provided along circumferential sides of the aluminum substrate 36. From the viewpoint of an electrical aspect, the aluminum substrate 36 has a heat transfer portion 36e, a connection portion 36f, and an insulation portion 36g. The connection portion 36f is electrically insulated from the heat transfer portion 36e by the insulation portion 36g. The connection portion 36f has the holes 36h.

<Upper Case>

As illustrated in the part (a) of FIG. 5 and the part (b) of FIG. 5, the shape of the resin upper case 32 is a frame shape. The upper case 32 has an upper surface and a lower surface which are open. The upper case 32 has a frame body 44, a rib structure 46, the input/output circuit 34, and a connector 48.

The frame body 44 has a pair of first wall portions 44a, a pair of second wall portions 44b, a frame body upper surface 44c (front surface), and a frame body lower surface 44d (rear surface). The pair of first wall portions 44a face each other. Further, one first wall portion 44a is separated from the other first wall portion 44a by a predetermined distance. The pair of second wall portions 44b face each other. The pair of second wall portions 44b are coupled to the pair of first wall portions 44a, respectively. The connector 48 for the input/output circuit 34 is provided in one second wall portion 44b.

The frame body upper surface 44c surrounds an upper opening. An upper portion cover 49 (refer to FIG. 3) made of a plate material is attached to the frame body upper surface 44c. The outer circumferential portion of the upper portion cover 49 comes into contact with the frame body upper surface 44c. Accordingly, the upper portion cover 49 closes the upper opening. A third sealing disposition groove 45 is provided on the frame body upper surface 44c. The third sealing disposition groove 45 surrounds the upper opening. An upper sealing member 40 (refer to FIG. 3) is disposed in the third sealing disposition groove 45. According to this configuration, when the upper portion cover 49 is pressed against the frame body upper surface 44c using screws B4, the upper sealing member 40 is squashed by the upper portion cover 49. The squashed upper sealing member 40 water-seals a part between the upper portion cover 49 and the upper case 32.

The frame body lower surface 44d surrounds a lower opening 44e (opening portion). The lower case 33 (refer to FIG. 3) is attached to the frame body lower surface 44d. Accordingly, the lower case 33 closes a part of the lower opening 44e.

The upper case 32 has four bosses 51. The bosses 51 protrude in a normal direction of the pair of first wall portions 44a. The bosses 51 have a surface which is flush with the frame body upper surface 44c. Moreover, the bosses 51 have holes 51h extending in a manner of being perpendicular to the frame body upper surface 44c. The holes 51h are simple penetration holes having no screw threads. The inner diameters of the holes 51h are slightly larger than the outer diameters of the bolts B1 (refer to FIG. 2).

<Rib Structure>

The upper case 32 has the rib structure 46. Generally, a rib in a frame structure such as the upper case 32 is provided to enhance the rigidity of the structure. The rib structure 46 of the present disclosure is provided to further enhance the rigidity of the circuit board 31.

The rib structure 46 includes main ribs 52 and subsidiary ribs 53 and exhibits a latticed structure in a plan view. The power device 37 and the capacitor 38 are disposed on an inward side of the lattice. Lower end surfaces 52a of the main ribs 52 and lower end surfaces 53a of the subsidiary ribs 53 (refer to the part (b) of FIG. 5) abut the front surface 36a of the aluminum substrate 36. In other words, the lower end surfaces 52a and 53a come into contact with the insulation film 41 of the circuit board 31. The lower end surfaces 52a and 53a stand upright from the front surface 36a in the normal direction of the front surface 36a. According to this structure, a cross-sectional secondary moment with respect to the bending in the normal direction increases. Accordingly, a sufficient resistance force can be generated against a force tending to bend the aluminum substrate 36 in the normal direction thereof.

The main ribs 52 extend between the pair of first wall portions 44a. Ends of the main ribs 52 on one side are coupled to the one first wall portion 44a. Ends of the main ribs 52 on the other side are coupled to the other first wall portion 44a. Accordingly, the main rib 52 faces the second wall portion 44b. The subsidiary ribs 53 extend between one main rib 52 and the other main rib 52. Accordingly, the subsidiary rib 53 faces another adjacent subsidiary rib 53 or the first wall portion 44a.

A specific configuration of the rib structure 46 is not limited to the foregoing configuration. The rib structure 46 may adopt various forms in accordance with the shape of the circuit board 31, disposition of electrical components included in the circuit board 31, or the like. For example, in the rib structure 46, any one of the main ribs 52 and the subsidiary ribs 53 may be omitted. In this case as well, compared to when the rib structure 46 is not provided, a resistance force can be generated against a force tending to bend the aluminum substrate 36 in the normal direction thereof. Accordingly, the rigidity of the circuit board 31 can be enhanced.

<Input/Output Circuit>

The upper case 32 has the input/output circuit 34 as illustrated in FIG. 6. The input/output circuit 34 secures electrical connection between a device disposed outside the inverter unit 30 and the circuit board 31. The input/output circuit 34 includes a plurality of bus bars which are formed by bending metal plates. Specifically, the input/output circuit 34 has a first input bus bar 54, a second input bus bar 56, a spacer 57, and output bus bars 58. The first input bus bar 54, the second input bus bar 56, and the output bus bars 58 are embedded in the upper case 32. For example, the input/output circuit 34 is embedded when the upper case 32 is molded through resin molding. According to this structure, a step of attaching the input/output circuit 34 to the upper case 32 becomes unnecessary in assembly work of the inverter unit 30. Accordingly, the inverter unit 30 can be easily assembled. As a result, positional accuracy required for a structure in which the circuit board 31 is attached to the inverter unit 30 can be easily satisfied.

One end 54a of the first input bus bar 54 and one end 56a of the second input bus bar 56 are disposed inside the connector 48. Ends 54b and 56b on the other side are disposed inside the accommodation space S. Specifically, the other end 54b of the first input bus bar 54 and the other end 56b of the second input bus bar 56 come into contact with the front surface 36a of the aluminum substrate 36. More specifically, the other ends 54b and 56b overlap the connection portion 36f of the circuit board 31 (refer to FIG. 8). A hole 54h is provided at the other end 54b. A hole 56h is provided at the other end 56b.

For example, the input/output circuit 34 of the present disclosure has three output bus bars 58. One end 58a of the output bus bar 58 protrudes downward from the frame body lower surface 44d of the upper case 32. The other end 58b of the output bus bar 58 is disposed inside the accommodation space S. Similar to the first input bus bar 54 and the like, the other end 58b of the output bus bar 58 also comes into contact with the front surface 36a of the aluminum substrate 36. More specifically, the other end 58b of the output bus bar 58 overlaps the connection portion 36f of the circuit board 31. A hole 58h is provided at the other end 58b.

<Lower Case>

As illustrated in the part (a) of FIG. 7 and the part (b) of FIG. 7, the shape of the lower case 33 is a plate shape. The lower case 33 has no wall portion which markedly stands upright as the upper case 32. The lower case 33 has a lower case inner surface 33a, a lower case outer surface 33b, and an exposure opening 59 (opening portion). The lower case inner surface 33a faces the upper case 32. The lower case inner surface 33a has a first sealing disposition groove 61, a second sealing disposition groove 62, and nut disposition holes 66. The lower case inner surface 33a faces the rear surface 36b of the aluminum substrate 36. The lower case outer surface 33b faces the bottom surface of the motor housing 8.

The exposure opening 59 is a penetration hole. The shape of the exposure opening 59 is a rectangular shape in a plan view. The exposure opening 59 exposes the exposure region SA on the rear surface 36b of the aluminum substrate 36. Accordingly, the lower case 33 covers the outer circumferential portion of the circuit board 31. However, the lower case 33 does not cover the exposure region SA on the inward side of the outer circumferential portion. For example, the shape of the exposure opening 59 is substantially the same as the shape of the thermal connection surface 22a of the heat sink 22. For example, the external shape of the exposure opening 59 is slightly larger than the external shape of the thermal connection surface 22a.

The first sealing disposition groove 61 is provided in the vicinity of the exposure opening 59. In addition, the first sealing disposition groove 61 surrounds the exposure opening 59. An inner sealing member 63 (first seal member, refer to FIG. 3) is fitted into the first sealing disposition groove 61. The second sealing disposition groove 62 surrounds a region in which the nut disposition holes 66 are provided. An outer sealing member 64 (second seal member, refer to FIG. 3) is fitted into the second sealing disposition groove 62.

As illustrated in FIG. 8, the nut disposition holes 66 face the connection portion 36f of the circuit board 31 when the lower case 33 is attached to the upper case 32. In other words, the nut disposition holes 66 face the other end 54b of the first input bus bar 54, the other end 56b of the second input bus bar 56, and the other end 58b of the output bus bar 58 when the lower case 33 is attached to the upper case 32. Bolts B3 are screwed into the nut disposition holes 66. The bolts B3 electrically connect the circuit board 31 to the first input bus bar 54. In addition, the bolts B3 electrically connect the circuit board 31 to the second input bus bar 56. Moreover, the bolts B3 electrically connect the circuit board 31 to the output bus bars 58. That is, the circuit board 31 is interposed between the bolts B3 and nuts N3. The nuts N3 are fitted into the nut disposition holes 66.

Hereinafter, operational effects conducted by the inverter unit 30 will be described. The inverter unit 30 conducts three operational effects, such as improvement in heat dissipation, ensuring water stopping characteristics, and improvement in assemblability.

The part (a) of FIG. 9 illustrates a cross-sectional structure at the time when an inverter unit 300 according to a comparative example is attached to the motor housing 8. The inverter unit 300 according to the comparative example differs from the inverter unit 30 of the present disclosure in having no rib structure 46. When the inverter unit 300 is attached to the motor housing 8, the rear surface 36b of the aluminum substrate 36 is thermally connected to the thermal connection surface 22a of the heat sink 22. Here, thermal connection includes connection via a heat conducting member such as a grease in addition to direct (physical) contact. At this time, a space between the rear surface 36b and the thermal connection surface 22a is filled with a grease 101.

When the bolts B1 (refer to FIG. 2) are fastened, the inverter unit 300 becomes closer to the motor housing 8. As a result, a gap between the rear surface 36b of the aluminum substrate 36 and the thermal connection surface 22a of the heat sink 22 is reduced. The gap is filled with the grease 101. When the gap is reduced, the rear surface 36b of the circuit board 31 and the thermal connection surface 22a of the heat sink 22 receive a force in a direction in which they are separated from each other from the grease 101. Since the heat sink 22 has a sufficient rigidity, it is deformed little. Accordingly, a great part of a force caused by the reduced gap acts on the rear surface 36b of the aluminum substrate 36. The outer circumferential portion of the aluminum substrate 36 is sandwiched between the upper case 32 and the lower case 33. Accordingly, the outer circumferential portion of the aluminum substrate 36 is not deformed. However, there is a possibility that a part exposed through the exposure opening 59 is bent upward due to a force. Further, when bending occurs, the gap between the rear surface 36b and the thermal connection surface 22a increases. The gap affects the heat resistance from the aluminum substrate 36 to the heat sink 22. Specifically, when the gap between the thermal connection surface 22a and the rear surface 36b increases, the heat resistance increases as well.

On the other hand, as illustrated in the part (b) of FIG. 9, the inverter unit 30 of the present disclosure has the rib structure 46 which is pressed against the front surface 36a of the aluminum substrate 36. The rib structure 46 has a sufficient rigidity with respect to a force bending the circuit board 31. Accordingly, bending of the circuit board 31 is curbed. As a result, extension of the gap between the rear surface 36b and the thermal connection surface 22a is also curbed. Accordingly, since a gap set in advance is maintained, increase in heat resistance is curbed. As a result, heat dissipation in the inverter unit 30 can be improved.

In the inverter unit 30, the exposure region SA (heat dissipation portion) on the rear surface 36b of the circuit board 31 on which the inverter circuit is provided is exposed through the exposure opening 59 of the lower case 33. Accordingly, heat generated in the circuit board 31 can be efficiently guided to the outside of the inverter unit 30 from the exposure region SA. For example, the outside of the inverter unit 30 is the heat sink 22. Moreover, the upper case 32 has the rib structure 46. The rib structure 46 pressurizes the circuit board 31 toward the lower case 33. As a result, bending of the circuit board 31 is curbed when a force acts on the circuit board 31 from the exposed region. Accordingly, enlargement of a gap between the rear surface 36b of the circuit board 31 and the thermal connection surface 22a of the heat sink 22 facing the rear surface 36b of the circuit board 31 is curbed. Increase in gap leads to increase in heat resistance. Accordingly, since enlargement of a gap is curbed by the rib structure 46, increase in heat resistance between the circuit board 31 and the heat sink 22 is curbed. Further, heat dissipation is improved.

In short, the inverter unit 30 accommodates the circuit board 31 (inverter) between the lower case 33 (resin component having the exposure opening 59) and the upper case 32. The power device 37 and the capacitor 38 are mounted on a front surface 31a of the circuit board 31. The power device 37 and the capacitor 38 form a three-phase inverter. The rear surface 36b of the aluminum substrate 36 is exposed on the rear surface 36b of the circuit board 31. Moreover, the rear surface 36b is exposed from the inverter unit 30 through the exposure opening 59 of the lower case 33. The exposure region SA which is a part of the exposed rear surface 36b of the aluminum substrate 36 is thermally connected to the heat sink 22 formed in the motor housing 8.

Specifically, the inverter unit 30 is assembled in the motor housing 8 by thrusting the bolts B1 into the bosses 51 provided in the upper case 32. The bosses 51 generate a force pressing the circuit board 31 toward the heat sink 22. Due to the force, the rear surface 36b (aluminum surface) of the aluminum substrate 36 of the inverter unit 30 is pressed toward the thermal connection surface 22a of the heat sink 22 at all times. Accordingly, movement of heat from the circuit board 31 to the heat sink 22 can be promoted.

As illustrated in FIG. 3, when the inverter unit 30 is assembled, work of sandwiching the circuit board 31 between the upper case 32 and the lower case 33 occurs. The input/output circuit 34 is already integrated with the upper case 32. There is a need for the circuit board 31 to be disposed at the other end of the input/output circuit 34 and on a lower side of the rib structure 46. Accordingly, it is difficult to dispose the circuit board 31 at a predetermined position from an upper side (frame body upper surface 44c side) of the upper case 32.

The resin case of the inverter unit 30 includes the upper case 32 and the lower case 33. The upper case 32 and the lower case 33 are separated from each other. In the inverter unit 30, the upper and lower surfaces of the upper case 32 accommodating various components are open. As a result, it is possible to access the inside of the inverter unit 30 from both sides of the upper surface and the lower surface. An example of a procedure in which the circuit board 31 is incorporated in the inverter unit 30 having such a configuration will be described.

The inner sealing member 63 is fitted into the first sealing disposition groove 61 of the lower case 33. The outer sealing member 64 is fitted into the second sealing disposition groove 62. Next, the nuts N3 are fitted into the nut disposition holes 66. Next, the circuit board 31 is placed on the lower case inner surface 33a of the lower case 33. Next, the lower case 33 is disposed on the frame body lower surface 44d of the upper case 32. That is, the circuit board 31 enters the inverter unit 30 from the frame body lower surface 44d side of the upper case 32. As a result, the circuit board 31 can be easily disposed at a predetermined position without being hindered by the bus bars and the rib structure 46 provided in the upper case 32. That is, the circuit board 31 is disposed on the lower side of various kinds of bus bars provided in the upper case 32 and on a lower end surface side of the rib structure 46. Further, the lower case 33 is fixed to the upper case 32 using bolts B2. The lower case 33 is fastened and is thus fixed to the upper case 32. That is, the circuit board 31 is interposed between the lower case 33 and the upper case 32. Next, the bolts B3 are thrust into the holes of the bus bars. Further, the bolts B3 are screwed into the nuts N3 disposed on the rear surface 36b side of the circuit board 31. The bus bar is fastened and is thus electrically connected to the circuit board 31.

In short, the resin case has the upper case 32 and the lower case 33. That is, the resin case is configured to be vertically separated. The circuit board 31 is attached to the lower case 33. On the other hand, several bus bars constituting the input/output circuit 34 are embedded in the upper case 32. Further, when the upper case 32 is assembled in the lower case 33, the bus bar can be connected to the circuit board 31. Accordingly, an inverter circuit can be formed. That is, in the inverter unit 30, assemblability of a system in which mechanical elements and electrical elements are integrated can be improved by unitizing the circuit board 31. That is, in the inverter unit 30, mass productivity can be improved by an insert method.

The inverter unit 30 is constituted as one unit. That is, the inverter unit 30 has a mechanical interface and an electrical interface. The inverter unit 30 is connected to components constituting the electric compressor 1 via these interfaces and exhibits the functions. The mechanical interface indicates the bosses 51 (which will be described below) for fixing the inverter unit 30 to the motor housing 8. The electrical interface indicates the first input bus bar 54, the second input bus bar 56, and the output bus bars 58 (which will be described below). Accordingly, bonding and connection via each of the interfaces are ensured, and thus the inverter unit 30 exhibits a function as a constituent component of the electric compressor 1. Accordingly, assemblability of the inverter unit 30 with respect to the motor housing 8 can be improved.

As illustrated in FIG. 10, the inverter unit 30 has water stopping characteristics. That is, work for ensuring the water stopping characteristics, such as having a sealing member interposed therebetween, is not required when the unitized inverter unit 30 is attached to the motor housing 8. That is, since the inverter unit 30 has water stopping characteristics, mechanical bonding and electrical connection may be considered. For example, mechanical bonding indicates bonding between the inverter unit 30 and the motor housing 8. For example, electrical bonding indicates that the first input bus bar 54, the second input bus bar 56, and the output bus bars 58 are bonded to the circuit board 31.

Water stop characteristics of the inverter unit 30 are ability for curbing infiltration of liquid (for example, rainwater) into a closed space (accommodation space S) surrounded by the upper portion cover 49, the upper case 32, the lower case 33, and the circuit board 31. In the inverter unit 30, infiltration paths of liquid to the closed space are connection portions between the components. For example, the connection portions between the components include a connection portion between the upper portion cover 49 and the upper case 32, a connection portion between the lower case 33 and the circuit board 31, and a connection portion between the upper case 32 and the lower case 33. In the inverter unit 30, sealing members corresponding to all of the connection portions are disposed.

The upper sealing member 40 is disposed in the connection portion between the upper portion cover 49 and the upper case 32. The upper sealing member 40 is fitted into the third sealing disposition groove 45 provided on the frame body upper surface 44c of the upper case 32. The inner sealing member 63 is disposed in the connection portion between the lower case 33 and the circuit board 31. According to this disposition, the inner sealing member 63 surrounds the exposure opening 59. Accordingly, the inner sealing member 63 curbs infiltration of liquid from between the rear surface 36b of the aluminum substrate 36 and the lower case inner surface 33a. The outer sealing member 64 is disposed in the connection portion between the upper case 32 and the lower case 33. According to this disposition, the outer sealing member 64 surrounds the circuit board 31. Accordingly, the outer sealing member 64 curbs infiltration of liquid from between the frame body lower surface 44d of the upper case 32 and the lower case inner surface 33a.

A water-stop structure may be provided or may not be provided between the inverter unit 30 and the motor housing 8. When a water-stop structure is not provided, water may infiltrate from between the inverter unit 30 and the motor housing 8. However, even in this case, water does not move into the inverter unit 30. For example, infiltrated water is discharged to the outside through a drain hole 71 provided in the motor housing 8.

In short, in the inverter unit 30, infiltration of water and air into the resin case is prevented by providing a sealing member between the circuit board 31 and the lower case 33. No screw is used for fixing the circuit board 31 to the lower case 33. That is, the rib structure 46 provided in the upper case 32 presses a non-mounting region on the front surface 31a. Due to this pressing, the inner sealing member 63 disposed on the inward side between the lower case 33 and the circuit board 31 is squashed. As a result, the squashed inner sealing member 63 exhibits water stopping characteristics. Accordingly, in the inverter unit 30, a risk of infiltration of water and air into the case is reduced. As a result, in the inverter unit 30, reliability of the circuit board 31 can be enhanced.

Hereinabove, the embodiment of the present disclosure has been described but the present disclosure is not limited to the foregoing embodiment and may be performed in various forms.

REFERENCE SIGNS LIST

1 Electric compressor
2 Housing
3 Rotation shaft
3a Tip portion
4 Compressor impeller
6 Rotor portion
7 Stator portion
8 Motor housing (casing)
9 Base housing
11 Compressor housing
12 Intake port
13 Scroll portion
14 Discharge port
15 Shaft end nut
16 Bearing
17 Circumferential wall
18 First outer wall
19 Second outer wall
21 Inverter accommodation portion
22 Heat sink
22a Thermal connection surface
23 Cooling water channel
30 Inverter unit
31 Circuit board
31a Front surface
32 Upper case (second case portion)
33 Lower case (first case portion)
33a Lower case inner surface (front surface)

33b Lower case outer surface (rear surface)
34 Input/output circuit
36 Aluminum substrate
36a Front surface
36b Rear surface
36h Hole
36e Heat transfer portion
36f Connection portion
36g Insulation portion
37 Power device
38 Capacitor
39 Metal plate
40 Upper sealing member
41 Insulation film
42 Control board
43 Current sensor
44 Frame body
44a First wall portion
44b Second wall portion
44c Frame body upper surface (front surface)
44d Frame body lower surface (rear surface)
44e Lower opening (opening portion)
45 Third sealing disposition groove
46 Rib structure
48 Connector
49 Upper portion cover
51 Boss
51h Hole
52 Main rib
52a Lower end surface
53 Subsidiary rib
53a Lower end surface
54 First input bus bar
54h Hole
56 Second input bus bar
56h Hole
57 Spacer
58 Output bus bar
58h Hole
59 Exposure opening (opening portion)
61 First sealing disposition groove
62 Second sealing disposition groove
63 Inner sealing member (first seal member)
64 Outer sealing member (second seal member)
66 Nut disposition hole
71 Drain hole
101 Grease
300 Inverter unit
A Rotation axis B1 Bolt
B2 Bolt
B3 Bolt
H1 Screw hole
N3 Nut
S Accommodation space
SA Exposure region (heat dissipation portion)

The invention claimed is:

1. An inverter device comprising:
a circuit board configured to have an inverter circuit provided on a front surface and a heat dissipation portion provided on a rear surface;
a first case portion configured to be provided with an opening portion for exposing the heat dissipation portion and to support a surrounding area of the heat dissipation portion; and
a second case portion configured to be provided with a rib structure pressed against the front surface of the circuit board and pressurizing the circuit board toward the first case portion side and to have the first case portion attached thereto,
wherein the circuit board is sandwiched between the first case portion and the second case portion.

2. The inverter device according to claim 1 further comprising:
a first seal member configured to be interposed between the rear surface of the circuit board and a front surface of the first case portion; and
a second seal member configured to be interposed between the front surface of the first case portion and a rear surface of the second case portion.

3. The inverter device according to claim 1,
wherein the first case portion is attached to the rear surface of the second case portion, and an opening portion is provided thereon,
wherein the second case portion has a bus bar electrically connected to the circuit board, and
wherein the bus bar is pressed against the front surface of the circuit board.

4. An electric compressor comprising:
the inverter device according to claim 1; and
a casing configured to have an inverter accommodation portion accommodating the inverter device,
wherein the inverter accommodation portion includes a heat sink to which the heat dissipation portion of the circuit board in the inverter device is thermally connected.

* * * * *